United States Patent [19]

Gratzel et al.

[11] Patent Number: 4,927,721

[45] Date of Patent: May 22, 1990

[54] PHOTO-ELECTROCHEMICAL CELL

[76] Inventors: Michael Gratzel, chemin du Marquisat 7a - CH-1050, Sts. Sulpica; Paul Liska, chemin des Bossons 47 - CH1018, Lausanne, both of Switzerland

[21] Appl. No.: 255,052

[22] Filed: Oct. 7, 1988

[30] Foreign Application Priority Data

Feb. 12, 1988 [CH] Switzerland ........................ 00505/88

[51] Int. Cl.$^5$ ............................................. H01M 6/36
[52] U.S. Cl. ...................................................... 429/111
[58] Field of Search ........................................... 429/111

[56] References Cited

FOREIGN PATENT DOCUMENTS 53-77188 7/1978 Japan .................................... 429/111

OTHER PUBLICATIONS

T. Yoko et al., *Res. Rep. Fac. Eng. Mie Unive.*, vol. 12, pp. 49–64 (1987), English pp. 59–74.
N. Vlachopoulos et al., *Surface Science*, vol. 189/190, pp. 823–831 (1987).
T. Osa et al., *Nature*, vol. 264, pp. 349–350 (1976).
W. D. Clark et al., *J. Am. Chem. Soc.*, vol. 99, No. 14, pp. 4676–4682 (1977).

*Primary Examiner*—Aaron Weisstuch
*Attorney, Agent, or Firm*—Kenyon and Kenyon

[57] ABSTRACT

The regenerative photo-electrochemical cell comprises a polycrystalline metal oxide semiconductor layer having a substantially monomolecular chromophore layer in a surface zone. The surface of the metal oxide semiconductor layer has a roughness factor of more than 20, preferably more than 200. Photo-electrochemical cells having such metal oxide semiconductors have good monochromatic efficiency using redox systems with iodides or bromides.

15 Claims, 2 Drawing Sheets

PHOTO-ELECTROCHEMICAL CELL

This invention relates to a photo-electrochemical cell and to a process of making the same.

As is known, photo-electrochemical cells constructed of semiconductor/electrolyte boundary layers have photo-electrochemical properties similar to those of the Schottky barrier of semiconductor/metal boundary layers. However, semiconductors having closely spaced conduction and valence bands in which the charge carriers of the semiconductor itself are photo-electrically excited with light, as is the case, for example, with silicon, gallium-arsenide, and cadmium sulphide, are photo-corrosively decomposed under light irradiation with the use of electrolytes.

Regenerative photo-electrochemical cells with stable metal oxide semiconductors have a poor yield when irradiated with light, particularly sunlight, since there is a relatively large distance between the valence band and the conduction band (3 eV $\approx$ 400 nm). Further, light absorption is restricted to light in the violet and ultraviolet range in the case of metal oxide semiconductors. Thus, while the metal oxide semiconductors are substantially transparent to light, they would be chemically stable and resistant when subjected to light irradiation using electrolytes.

The sensitivity, i.e., the photo-electrochemical yield for visible light, and hence also for sunlight, can be increased by chemically adding or incorporating (chemisorbing) chromophores, also known as sensitizers or dyes, as charge carriers on the surface of a semiconductor. In such a case, the two functions of light absorption and charge carrier separation are then separated. The light absorption is carried out by the chromophore in the surface zone and the separation of the charge carriers takes place at the semiconductor/chromophore boundary layer. However, in such electrochemical systems with metal oxide semiconductors having a smooth surface, the yield in the maximum of the absorption spectrum (ELECTRICAL ENERGY GENERATED as a percentage of INCIDENT PHOTON ENERGY) is at most only in the region of just a few tenths of a percent, for example, in the range of 0.1 to 0.2%.

Accordingly, it is an object of this invention to provide a durable regenerative photo-electrochemical cell whose polycrystalline metal oxide semiconductor does not corrode and which has an improved electrical energy yield in the light spectrum range, more particularly the sunlight spectrum.

It is another object of the invention to provide a simple process for the production of metal oxide semiconductors of relatively high efficiency in the conversion of sunlight to electrical energy.

It is another object to improve the efficiency of a regenerative photo-electrochemical cell.

It is another object of the invention to provide a solar cell having a relatively high efficiency.

Briefly, the invention provides a regenerative photo-electrochemical cell having a polycrystalline metal oxide semi-conductor with a surface having a roughness factor of more than 20 and preferably more than 150, for example, about 200, and a monomolecular chromophore layer on the surface of the semi-conductor. The roughness is defined as the ratio of an actual/effective surface to the projected area of that surface of a body, i.e., in the present case, the photo-electrochemically active surface of the metal oxide semi-conductor.

The invention also provides a process of making an improved regenerative photo-electrochemical cell with a polycrystalline metal oxide semi-conductor. In this respect the process employs the SOL-GEL process (described in detail, for example, in Stalder und Augustynski, *J. Electrochem. Soc.* 1979, 126, 2007) and maintains the percentage relative humidity of the ambient atmosphere in a metal alcoholate hydrolysis step of the process within a range of 30% to 80% and is kept constant within plus or minus 5%, preferably plus or minus 1%. The process produces metal oxide semiconductor layers with which a very high electrochemical yield can be obtained in photo-electrochemical cells. A monochromatic efficiency of 14% can be obtained particularly with a titanium oxide layer of this kind produced at a relative humidity in the range of 48%, the efficiency denoting the electrical power in the optimal point as a percentage of the incident light energy.

The invention also provides a solar cell comprised of the polycrystalline metal oxide semi-conductor layer having a photo-electrochemically active surface with a roughness factor of more than 20, a monomolecular chromophore layer on the active surface, an electrolyte layer on the chromophore layer and an electrode on the electrolyte layer.

The rough surface with a polycrystalline structure offers an area greater by the roughness factor for a monomolecular surface layer of the chromophore. Consequently, the light incident on an area of a specific size is converted to electrical energy with a considerably greater yield. The metal oxide semiconductor layer can be regarded as transparent to the incident light flux. However, light is partially reflected on the surface and partly reaches adjacent surfaces. The light penetrating the metal oxide semiconductor layer and light not absorbed and converted by the monomolecular chromophore layer encounters chromophore molecules on the exit side partly directly and partly indirectly, after total reflection on the surface, so that a considerably higher light yield can be obtained.

Different chromophores have different spectral sensitivities. The choice of chromophore can thus be adapted to the spectral composition of the light of the light source in order to increase the yield as far as possible.

Particularly suitable metal oxide semiconductors are oxides of the transition metals, and of elements of the third main group and of the fourth, fifth and sixth secondary groups (of the periodic system of elements) of titanium, zirconium, hafnium, strontium, zinc, indium, yttrium, lanthanum, vanadium, niobium, tantalum, chromium, molybdenum, tungsten, or alternatively oxides of zinc, iron, nickel or silver, perovskites such as $SrTiO_3$, $CaTiO_3$ or oxides of other metals of the second and third main groups or mixed oxides or oxide mixtures of these metals. Alternatively, any other conductive metals oxide with semiconductor properties and a large energy gap (band gap) between the valency band and the conductivity ban can be used.

Examples of suitable chromophores, i.e., sensitizers, are complexes of transition metals of the type metal $(L_3)$, $(L_2)$ of ruthenium and osmium (e.g., ruthenium tris (2, 2'bipyridyl-4,4'dicarboxylate), ruthenium cis - diaqua bipyridyl complexes, such as ruthenium cis diaqua bis (2,2'bipyridyl-4,4'dicarboxylate) and porphyrins (e.g. zinc tetra (4-carboxyphenyl) porphyrin) and cyanides (e.g. iron-hexacyanide complexes) and phthalocyanines.

The chromophores may be chemi-sorbed, adsorbed or otherwise be permanently added in the region of the surface of the metal oxide semiconductor. Favorable results are obtained, for example, with chromophores bonded to the surface of the metal oxide semiconductor by carboxylic acid ligands instead of ester ligands.

Examples of an electrolyte for such photo-electrochemical cells are iodide, bromide, hydroquinone, or other redox systems. Because of their redox potential, these electrolytes act as pure relay substances for the charge transport. Examples of suitable redox systems are approximately $10^{-2}$ M solutions of such redox systems with 1 mM $HClO_4$ as electrolyte supporting the charge transport.

The SOL-GEL process will be described hereinafter with reference to an example relating to the production of a titanium oxide layer (TiO-hd 2) having a high roughness factor on a titanium substrate.

The titanium substrate consisting of pure titanium of about 99.5% purity is first cleaned for about 30 minutes in approximately 18% boiling HCl. A titanium-ethoxide solution is obtained, for example, by dissolving 21 mMol $TiCl_4$ in 10 ml of pure ethanol (puriss.) This solution is then diluted with very pure methanol (puriss.) to give a titanium concentration in the range of about 25 to 50 mg/ml. A drop of the solution is applied to the titanium substrate and the resulting titanium alkoxide is hydrolyzed at room temperature for about 30 minutes at a humidity of 48% plus or minus 1%. The substrate is then heated with the hydrolyzed layer for about 15 minutes at about 450° C. This process is repeated several times. The process is further described in N. Vlachopoulos, et al. Efficient Spectral Sensitisation of Polycrystalline Titanium Dioxide Photoelectrodes, *Surface Science*, 189/190 (1987) North-Holland Amsterdam, pp. 823–831.

After being repeated ten to fifteen times, the $TiO_2$ layer reaches a thickness of about $20\mu$. The substrate with the layer is then heated at about 550° C. for about 30 minutes in a pure argon atmosphere (e.g. 99.997%). The $TiO_2$ layer prepared in this way has a roughness factor in the range of 200. Such metal oxide semiconductor layers (of other metals as well) can be produced on other substrates by similar methods.

The chromophore, e.g., $RuL_3^{4-}$, is applied by immersing the substrate with the oxide layer in an aqueous solution of $2 \times 10^{-4}$M $RuL_3^{4-}$, having a pH of about 3.5, for about 1 hour (pH adjusted with dilute HCl). Other chromophores can be applied to titanium oxide or other metal oxide semiconductors by similar processes.

These and other objects and advantages of the invention will become more apparent from the following detailed description taken in conjunction with the accompanying drawings wherein.

Figure 3:
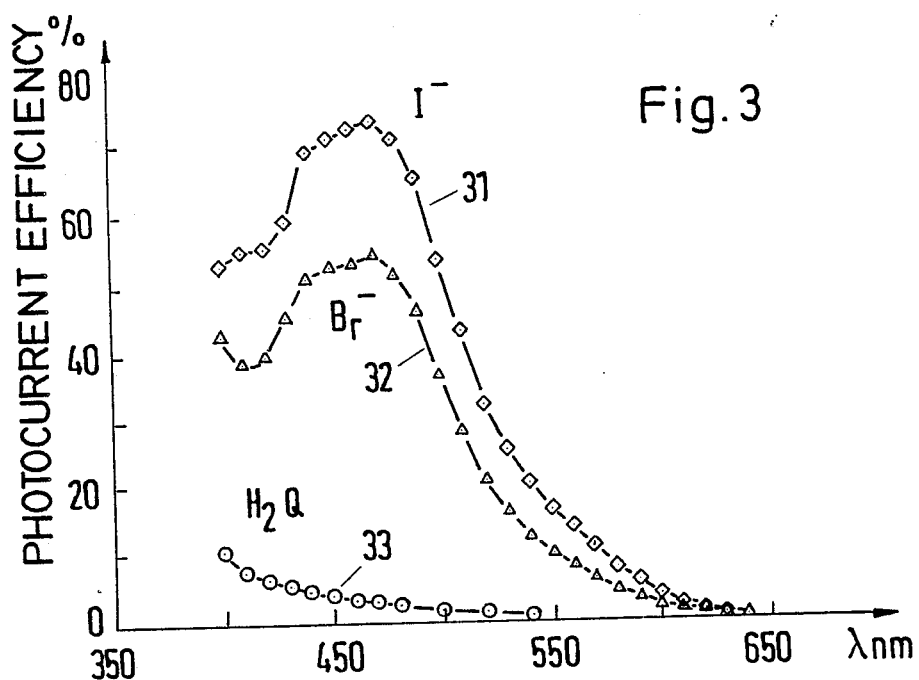
Figure 4:
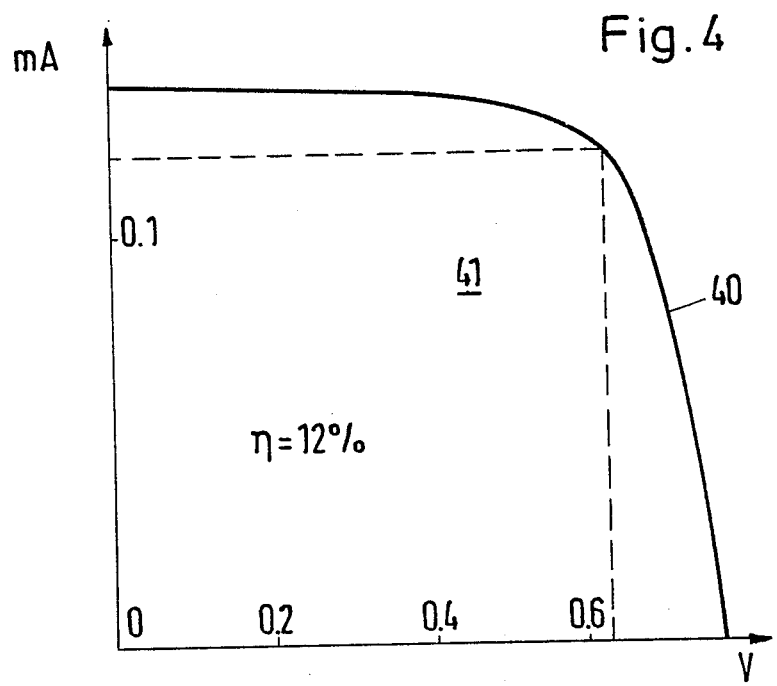

FIG. 3 graphically illustrates the photocurrent efficiency as a percentage of the incident light flux against the wavelength of the light for a titanium oxide with $RuL_3^{4-}$ as chromophore and using different electrolytes; and FIG. 4 graphically illustrates the photocurrent/voltage characteristic of a photo-electrochemical cell with $RuL_3^{4-}$ coated titanium oxide for incident light of 470 nm wavelength.

Figure 1:
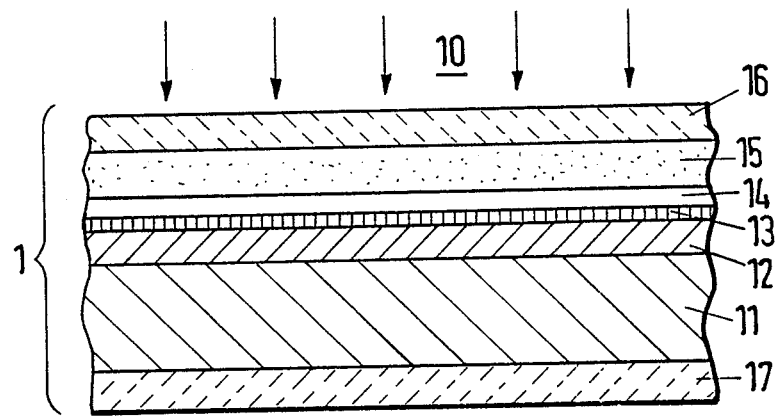
FIG. 1 illustrates a diagrammatic cross-sectional view of a photo-electrochemical cell with a chromophore-coated metal oxide semiconductor layer according to the invention.

Referring to FIG. 1, (not to scale) the photoelectric cell comprises a metal support 11, to which there is applied a metal oxide semiconductor layer 12, for example of titanium oxide, having a high roughness factor of, for example, 200 and a thickness of about $20\mu$. A monomolecular layer of sensitizer or chromophore (dye) 13, for example $RuL_3^{4-}$, is disposed on the surface of the semi-conductor layer 12 and adjoins an electrolyte layer 14, which on the other side adjoins a conductive electrode 15 consisting, for example, of conductive glass or plastic. The cell 1 is closed at the top and bottom by an insulating layer 16, 17, respectively.

The conductive electrode 15 and the insulating layer 16 must be transparent to the light 10 so that the light can reach the chromophore for conversion to electrical energy. The lateral termination (not shown) of a cell 1 of this kind may be a frame of electrically insulating material, e.g., plastic or glass.

Figure 2:
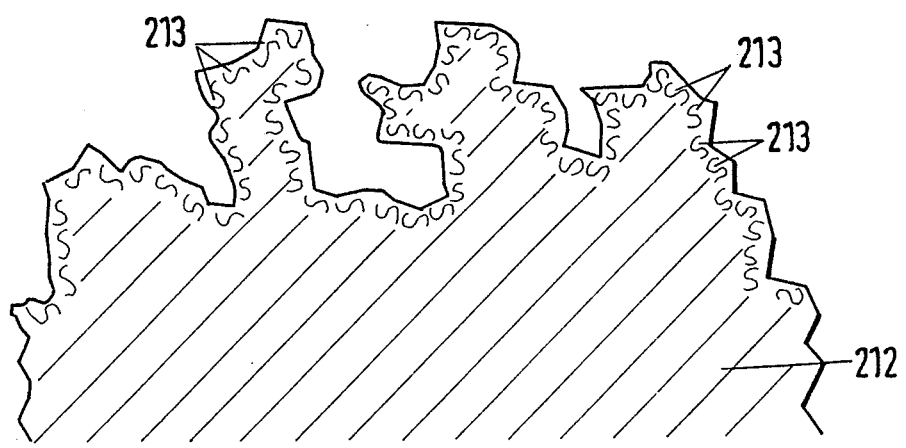
FIG. 2 illustrates a diagrammatic section through a metal oxide semiconductor with a monomolecular chromophore layer.

FIG. 2 is a highly enlarged diagram of a metal oxide semiconductor layer 212 having a high roughness factor, with the monomolecular layer of chromophore molecules 213 disposed in the surface zone. This monomolecular layer may, for example, consist of adsorbed chemisorbed chromophore molecules 213. Atoms or molecules may initially be doped into the surface layer of the metal oxide semiconductor and the chromophore molecules be built up there around.

FIG. 3 illustrates two curves showing the percentage of photochemically generated current of a photo-electrochemical cell with $TiO_2$ as metal oxide semiconductor and $RuL_3^{4-}$ as chromophore, with respect to the incident light flux for different wavelengths and for different electrolytes. The y-axis shows the percentage photocurrent efficiency and the x-axis the wavelength of the incident light in nm. The basic electrolyte used was an aqueous solution of $HClO_4$ ($10^{-3}$ M(molar)). In the series of measurements forming the basis of curve 31, $RuL_3^{4-}$ coated $TiO_2$ was used and as an additional electrolyte 1 M KI as electron donor. In the series of measurements on which curve 32 is based, $RuL_3^{4-}$ coated $TiO_2$ was used and as an additional electrolyte 0.1 M NaBr as electron donor. For comparison, curve 33 shows a series of measurements in which $TiO_2$ was used without a chromophore and 0.01 M hydroquinone was used as an additional electrolyte.

FIG. 4 shows a photocurrent/voltage curve 40 (characteristic) of a regenerative photo-electrochemical cell with an $RuL_3^{4-}$ coated $TiO_2$ oxide semiconductor as photo-anode and a platinum companion electrode. The y-axis shows the current of the cell in milliamps and the x-axis the voltage in volts. The cell area is 4 square centimeters ($cm^2$). The light incident on the cell has an area-specific power of 1.58 watts per square meter ($W/m^2$). The cell is thus irradiated with 0.632 mW light. The electrolyte contains $10^{-3}$ M $HClO_4$, 1 M LiBr and $10^{-3}$M $Br_2$. The wavelength of the exiting light is 460 nm. The fill factor 41 (represented by the area of the rectangle having the two broken-line sides) is 0.74 and is in the range of cells with monocrystalline silicon. (The fill factor of a cell equals the maximum output power divided by the product of the short circuit current times the voltage on the open circuit).

That is:

$$\text{space factor} = \frac{\text{maximum output power}}{\text{short circuit current} \times \text{voltage on open circuit}}$$

The monochromatic efficiency of this cell is 12% and is defined as (power at - optimal point×100)/(incident light energy).

The invention thus provides a regenerative photo-electrochemical cell which is able to convert sunlight to electrical energy at relatively high efficiency rates and which is capable of use as a solar cell.

The invention also provides a process of making a regenerative photo-electrochemical cell of high efficiency in converting sunlight to electrical energy.

What is claimed is:

1. A regenerative photo-electrochemical cell comprising
    a polycrystalline metal oxide semi-conductor having a surface with a roughness factor of more than 20; and
    a monomolecular chromophore layer on said surface of said semi-conductor.

2. A regenerative photo-electrochemical cell as set forth in claim 1 wherein said semiconductor is made of a material selected from the group consisting of at least one of an oxide of a transition metal, an element of the fourth, fifth or sixth secondary groups, an oxide of zinc, iron, nickel or silver, a perovskite, and a perovskite of said metals.

3. A cell as set forth in claim 1 wherein said semi-conductor is made of a material selected from the group consisting of titanium, zirconium, hafnium, strontium, zinc, indium, yttrium, lanthanum, vanadium, niobium, tantalum, chromium, molybdenum, and tungsten.

4. A cell as set forth in claim 1 wherein said semi-conductor is made of a material selected from the group consisting of $SrTiO_3$ and $CaTiO_3$.

5. A cell as set forth in claim 1 wherein said chromophore layer is formed of transition metal complexes.

6. A cell as set forth in claim 5 wherein said chromophore layer is made of a transition metal complex selected from the group consisting of ruthenium tris ($RuL_3$), ruthenium bis ($RuL_2$), osmium tris ($OsL_3$), osmium bis ($OsL_2$), and ruthenium cis diaqua bypyridyl complex of the type $RuL_2(H_2O)_2$.

7. A cell as set forth in claim 6 wherein said chromophore layer is made of ruthenium cis diaqua bis (2,2'-bipyridyl-4,4'-dicarboxylate).

8. A photo-electrochemical cell as set forth in claim 1 wherein said chromophore layer is made of phthalocyanine or porphyrin of metal or non-metal.

9. A regenerative photo-electrochemical cell as set forth in claim 1 further comprising carboxylic acid ligands bonding said chromophore layer to said semiconductor layer.

10. A regenerative photo-electrochemical cell as set forth in claim 1 further comprising an electrolyte layer on and over said chromophore layer, said electrolyte layer having at least one of an iodide, bromide, and hydroquinone therein.

11. A regenerative photo-electrochemical cell for converting sunlight to electrical energy comprising
    a polycrystalline metal oxide semi-conductor layer having a photo-electrochemically active surface with a roughness factor of more than 20; and
    a monomolecular chromophore layer on said surface.

12. A cell as set forth in claim 11 wherein said active surface has a roughness factor of more than 150.

13. A cell as set forth in claim 11 further comprising an electrolyte layer on said chromophore layer and an electrode on said electrolyte layer.

14. A cell as set forth in claim 13 further comprising a metal support having said semi-conductor layer thereon.

15. A solar cell comprising
    a polycrystalline metal oxide semi-conductor layer having a photo-electrochemically active surface with a roughness factor of more than 20;
    a monomolecular chromophore layer on said surface;
    an electrolyte layer on said chromophore layer;
    an electrode on said electrolyte layer; and
    a support having said semi-conductor layer thereon.

* * * * *

UNITED STATES PATENT AND TRADEMARK OFFICE
CERTIFICATE OF CORRECTION

PATENT NO. : 4,927,721

DATED : May 22, 1990

INVENTOR(S) : Michael Gratzel, et al

It is certified that error appears in the above-identified patent and that said Letters Patent is hereby corrected as shown below:

Column 2, line 59 change "metals oxide" to -metal oxides-
Column 3, line 19 change "TiO-hd 2)" to $-(TiO_2)-$ Signed and Sealed this Fifth Day of November, 1991

*Attest:*

HARRY F. MANBECK, JR.

*Attesting Officer*  Commissioner of Patents and Trademarks